July 14, 1970 KAZUHIRO KURATA 3,520,735

METHOD OF MANUFACTURING SEMICONDUCTOR DEVICES

Filed Oct. 12, 1965 3 Sheets-Sheet 1

INVENTORS
KAZUHIRO KURATA
TATUO TOKAI
TADAMASA HIRAI

BY Paul M. Craig, Jr.

ATTORNEY

INVENTORS
KAZUHIRO KURATA
TATUO TOKAI
TADAMASA HIRAI

BY Paul M. Craig, Jr.

ATTORNEY

METHOD OF MANUFACTURING SEMICONDUCTOR DEVICES

Filed Oct. 12, 1965

INVENTORS
KAZUHIRO KURATA
TATUO TOKAI
TADAMASA HIRAI

BY Paul M. Craig, Jr.
ATTORNEY

United States Patent Office 3,520,735
Patented July 14, 1970

3,520,735

METHOD OF MANUFACTURING SEMICONDUCTOR DEVICES

Kazuhiro Kurata, Hachioji-shi, Tatuo Tokai, Kokubunji-shi, and Tadamasa Hirai, Tokyo, Japan, assignors to Hitachi, Ltd., Tokyo, Japan, a corporation of Japan Filed Oct. 12, 1965, Ser. No. 495,215
Claims priority, application Japan, Oct. 20, 1964, 39/59,309
Int. Cl. H01l 7/32, 7/34
U.S. Cl. 148—1.5 16 Claims

ABSTRACT OF THE DISCLOSURE

A method of forming a crystal wherein a heterojunction is formed between dissimilar semiconductor materials which comprises interposing a solvent material between two dissimilar semiconductor materials, said solvent material having a eutectic point with one of said semiconductor materials which is lower than the melting point of the other semiconductor material, heating the resulting composite to a temperature higher than the eutectic point of the solvent material and said selected semiconductor material but lower than the melting point of the other semiconductor material, to form a mixture solution, and cooling the composite to recrystallize one semiconductor material onto the other semiconductor material. Also an alloy of the solvent material and one of said semiconductor materials can be used in contact with the other semiconductor material.

The present invention relates to a method of manufacturing semiconductor devices, in particular semiconductor devices having a heterojunction.

Heretofore, as a method of forming a heterojunction between semiconductors, the epitaxial vapor growth method has been known. In this method, a crystal of a certain kind of semiconductor material is made grow epitaxially on a surface of a crystal of another kind of semiconductor material by vapor deposition or chemical reaction such as disproportionate reaction. However, since this eptiaxial vapor growth method needs to be practised in a vacuum or in a carrier gas containing a transport reagent, the apparatus for working this method becomes complicated. In case particularly the disporportionation reaction is utilized, the control of, in addition to the temperature of a substrate crystal, the temperature of a source material, the concentration of the transport reagent, the flow rate of the carrier gas in the case of the open tube method, and the like are needed and the operation becomes complicated as well. Further, because these conditions should be satisfied for each of the two kinds of semiconductor materials in one and the same apparatus, even for an appropriate combination of semiconductors from the consideration of the solid state physics such as the crystal structure and the like, the possibility of forming the heterojunction between them by the epitaxial vapor growth method is often restricted by whether or not there is an appropriate chemical reaction and condition of vapor deposition. Besides, generally in the epitaxial vapor growth method, the quantitative relation of impurity between the source material and a growth layer is not so simple that the control of doping is not easy.

A few reports have been made of the method in which a semiconductor crystal of different kind is made grow on a surface of substrate crystal from liquid phase. This is the so-called travelling solvent method in which a solvent metal such as Ga is put between a Ge substrate crystal and a GaAs crystal, and after this portion has been heated to melt, the molten zone is made travel in one direction. In this method, according to all examples reported up to now, it is a necessary condition to maintain the temperature of the molten zone higher than the melting point of the solvent metal. More specifically, since the eutectic temperatures between the solvent metal and each of two kinds of semiconductors to form a heterojunction therebetween are almost equal to the melting temperature of the solvent metal, in order to form a solution of the solvent metal and one of the semiconductors, it is necessary to make the temperature of the solvent metal higher than its melting point, in which case the other semiconductor melts, necessarily, into the solution. Accordingly, the two kinds of semiconductor materials melting in the molten zone, it is very difficult to preferentially crystallize only one kind of semiconductor on the substrate crystal as the molten zone travels or cools, and hence the reproducibility of the heterojunction is poor.

An object of the present invention is to eliminate the aforementioned deficiencies of the conventional methods. According to the method of the present invention, the operation is easy and the apparatus is simple, and, in particular, heterojunctions are formed surely with good reproducibility. The method of the present invention is applicable to a large number of combinations of semiconductors.

Other objects and advantages of the present invention will become apparent from the following description when taken in conjunction with the accompanying drawings in which.

Figure 1:
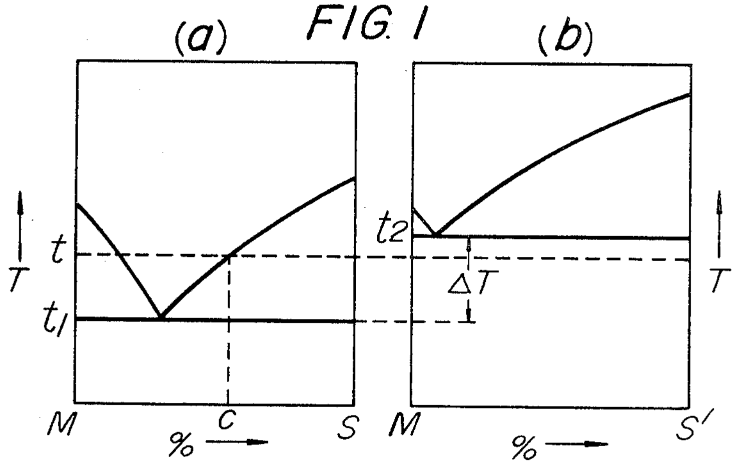
FIG. 1 is phase diagrams explaining the principle of the present invention.

Now referring to FIG. 1, wherein FIG. 1(*a*) is a phase diagram of a semiconductor S and a material M and FIG. 1(*b*) is a phase diagram of another semiconductor S′ and the material M, it is assumed that there is a temperature difference ΔT between the eutectic temperatures $t_1$ and $t_2$ of the diagrams of FIGS. 1(*a*) and 1(*b*). Since $t_2$ is assumed to be higher than $t_1$, if a comparatively small quantity of the material M is made contacted with both of the semiconductors S and S′, and if the temperature $t$ thereof is maintained higher than $t_1$ but lower than $t_2$, the semiconductor S dissolves into the material M to become a liquid having a composition C at equilibrium state. As far as $t-t_1<\Delta T=t_2-t_1$, the semiconductor S′ does not melt in the material M at all. Consequently, if the temperature of this liquid is lowered to the temperature higher than $t_1$, only the semiconductor S crystallizes. If the two kinds of semiconductors S and S′ have similar crystal structures and lattice constants to each other, the semiconductor S in the liquid crystallizes on the semiconductor S′, and the formation of heterojunction is possible.

The above description is for the case wherein each of the semiconductors S and S′ has a eutectic temperature line with the material M in the phase diagram. However, even in the case where the one semiconductor S′ forms a solid solution with the material M, if the other semiconductor S has with the material M a eutectic temperature line lower than the melting point of the material M, the formation of heterojunction is likewise possible.

Hereinbelow a few embodiments of the present invention will be described.

EXAMPLE 1

Figure 2:
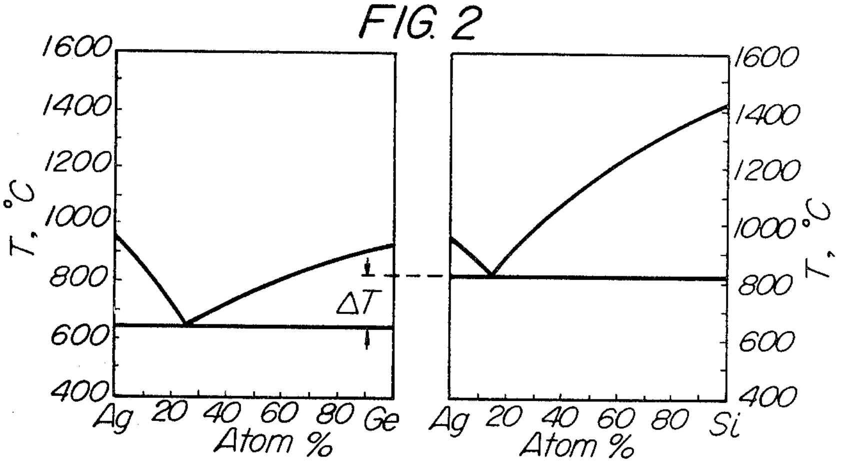
FIGS. 2 to 5 are phase diagrams explaining respectilvely the principles of Examples 1 to 4.
Figure 6:
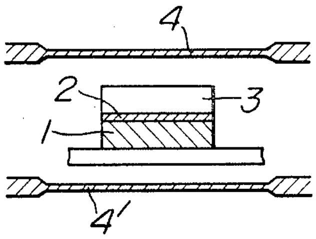
FIGS. 6 to 9 are diagrams showing apparatuses and specimens of Examples 1 to 4, respectively.
Figure 10:
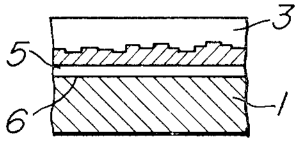
FIGS. 10 to 13 are sectional views of the junctions of semiconductor crystals formed respectively by the methods of Examples 1 to 4.

In FIG. 2 are shown the phase diagrams between Ge and Ag and between Si and Ag in a manner that the difference ΔT between their eutectic temperatures is clearly expressed. As shown in FIG. 6, a single crystal wafer 1 of Si cut along (III) surface is mechanically polished and chemically etched on its upper surface to become specular, on which surface is formed an electrochemical deposition layer 2 of Ag, on which layer further a crystal wafer 3 of Ge is arranged. The resulting assembly is heated in flowing argon gas by energizing ribbon shaped tungsten heaters 4 and 4′ so as to maintain the temperature of Ge and Si inclusive of the electrochemical deposition layer 2 at about 750° C. for about 30 minutes, after which the temperature on the side of Si is slightly lowered to approximately 720° C. by lessening the input power to the lower heater 4′, and, at the same time, the input power to the upper heater 4 is slightly enhanced. After this state has been maintained for about 2 hours, the whole system is cooled, and then the specimen is taken out. From the inspection of a cross section containing each junction through a microscope and an X-ray micro-analizer, it was found that, as shown in FIG. 10, a crystallized layer of Ge approximately 100μ thick existed on the upper surface of the single crystal wafer 1 of Si in the same crystal direction as Si and in single crystal structure. The formation of heterojunction was also confirmed from the electrical properties of the portion containing the junction 6. The number of Ag atoms intruded into the crystallized layer 5 of Ge was less than $10^{15}$/cc., and the electrical properties of the junction were satisfactory. The thickness of the crystallized layer 5 could be varied to a great extent, e.g. from about one micron to several hundred microns, by appropriately selecting the initial temperature and the temperature on the side of Si within the range of ΔT shown in FIG. 2, and by varying the heating duration. In this example, although the electrochemical deposition layer 2 of Ag was attached to Si, the heterojunction can also be formed by attaching the electrochemical deposition layer 2 to Ge 3. Further, the heterojunction can likewise be formed only by inserting the solvent metal between the two semiconductors instead of electrochemically depositing. For methods similar to this example, what is demanded of the property of the solvent metal is, besides the conditions described in connection with the aforementioned principle, a small solid solubility or a small distribution coefficient to a semiconductor to be crystallized.

EXAMPLE 2

Figure 3:
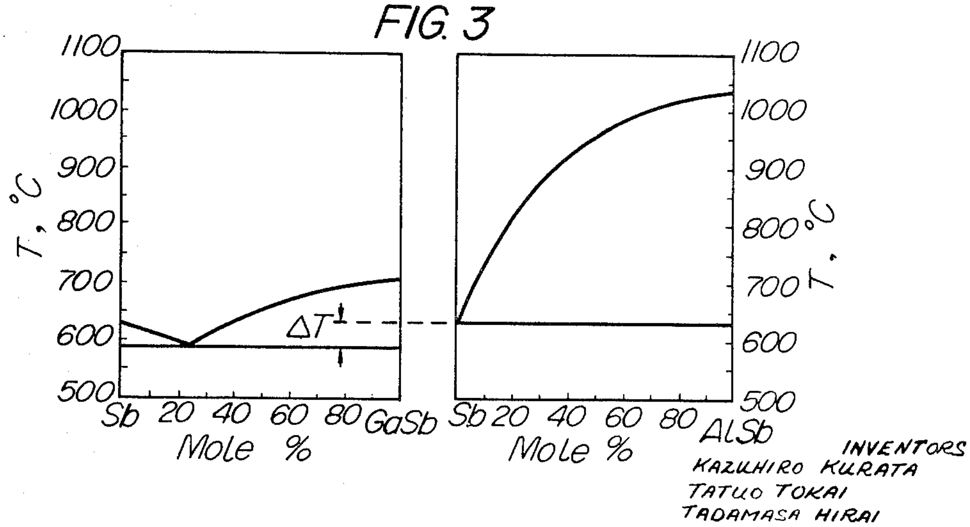
Figure 7:
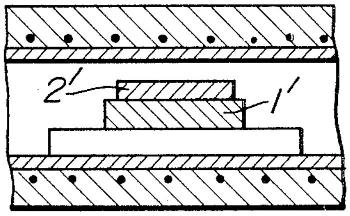
Figure 11:
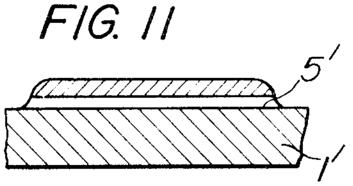

FIG. 3 is phase diagrams of $III_B$–$V_B$ compound semiconductors GaSb and AlSb against group V element Sb represented in the same manner as FIG. 2. As shown in FIG. 7, on the upper surface of a single crystal wafer 1′ of AlSb cut along (III) surface is placed a Sb-GaSb alloy 2′ which is homogenized by quenching and crystallizing a molten mixture of GaSb and Sb, and this assembly is heated to 620° C. In an inert gas atmosphere such as argon or the like. After the Sb-GaSb alloy 2′ has completely melted, this temperature is maintained for 30 minutes. Then, the assembly is cooled slowly at the rate of approximately 5° C./hr. to a temperature lower than 600° C., and then is subjected to air cooling to room temperature. The inspection of the specimen showed that, as shown in FIG. 11, a crystallized layer 5′ of GaSb had grown to the thickness of about 100μ on the upper surface of the single crystal wafer 1′ of AlSb, and a heterojunction of AlSb and GaSb was formed. In this example also, the thickness of the crystallized layer 5′ was possible to be broadly controlled by appropriately varying the maintained temperature of the melt and the temperature range of the slow cooling within the range of ΔT shown in FIG. 3. The influence of the intrusion of Sb into the GaSb crystallized layer 5′ and the AlSb substrate crystal on the electrical property of the heterojunction was not recognized at all. It was also found that the conductivity type of the GaSb crystallized layer 5′ and the carrier concentration were controllable by initially doping the Sb-GaSb alloy with a dopant which is to give an appropriate conductivity type to GaSb.

EXAMPLE 3

Figure 4:
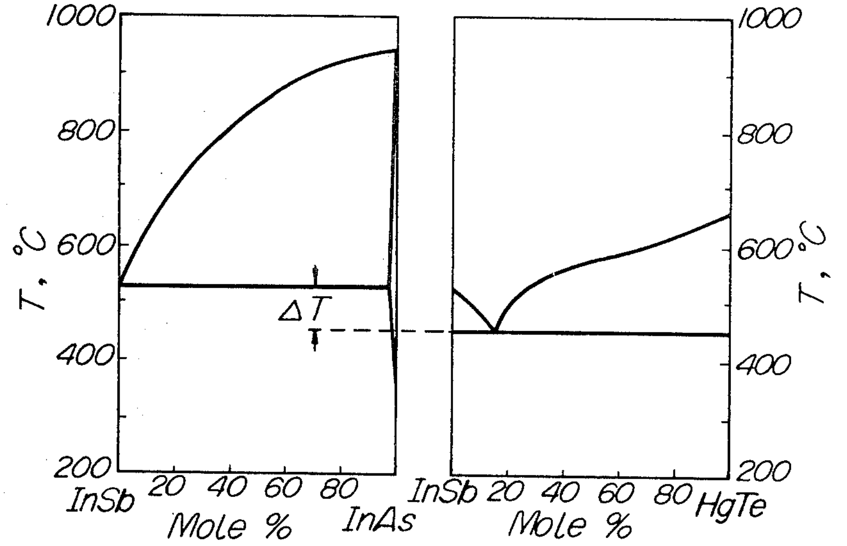

FIG. 4 is phase diagrams of InAs and HgTe against InSb. In particular, the phase diagram of the InSb-HgTe system was determined by the inventors through thermal analysis in order to apply the method of the invention.

Figure 8:
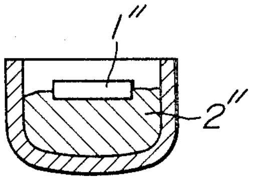
Figure 12:
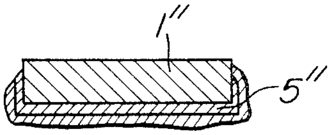

As shown in FIG. 8, into the solution 2″ of elements In, Sb, Hg, and Te mixed in such a proportion as to obtain the same composition as InSb containing 18 mole percent of HgTe, maintained at 500° C. in an argon atmosphere, is dipped a single crystal wafer 1″ of InAs chemically polished on its surface. After this state has been maintained for about 30 minutes, the temperature is lowered slowly at the rate of about 5° C./hr. to the vicinity of 470° C., and then the dipped material is taken out of the solution. The inspection of a cross-section of the specimen showed that, as shown in FIG. 12, on the surface of the dipped portion of the InAs single crystal wafer 1″ grew a HgTe crystallized layer 5″ about 30–100μ thick, and a heterojunction of InAs and HgTe was formed. As a result, it is evident that a heterojunction can be formed by the method of the invention even if the crystal surface of a substrate semiconductor is different from the (III) surface. The influence of the probable intrusion of the elements In, Sb, Hg or Te constituting the solution 2″ into the crystallized layer 5″ on the characteristics of the heterojunction was not recognized. It will be naturally supposed as in the Example 2 that the electrical characteristics of the crystallized layer can be controlled by initially doping the solution 2″ with an appropriate dopant. Of course, the temperature of the solution 2″ into which the InAs single crystal wafer 1″ is dipped and the composition of the solution can be varied within ΔT as shown in FIG. 4 and within the range regulated by ΔT.

EXAMPLE 4

Figure 5:
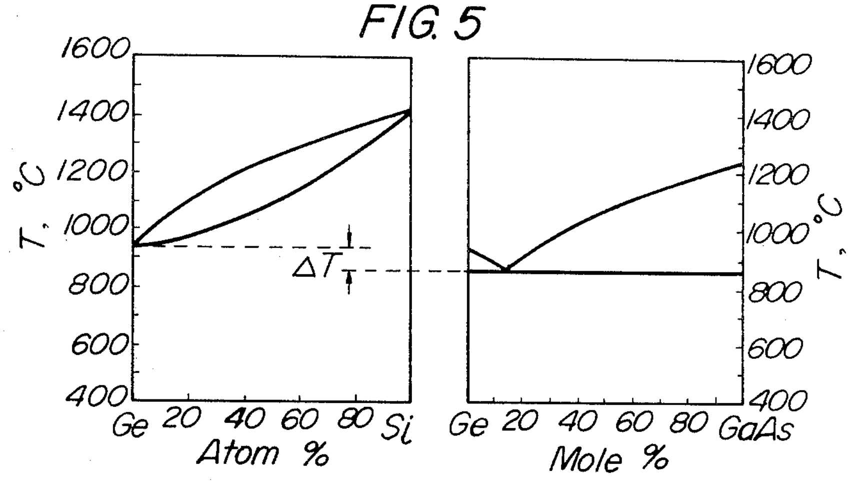
Figure 9:
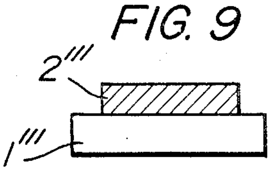
Figure 13:
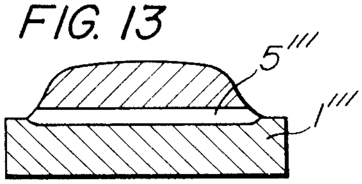

FIG. 5 is phase diagrams of Si and GaAs against Ge. In particular, the phase diagram of Ge-GaAs system was experimentally determined by the inventors in order to embody the method of the present invention. As shown in FIG. 9, a Ge-GaAs alloy wafer 2‴ which is homogenized by quenching and crystallizing a molten mixture of 80 mole percent of Ge and including 20 mol percent of GaAs was put on the upper surface of Si crystal wafer 1‴ from which surface damages had been removed by chemical etching, and heated to 930° C. in an inert or reducing atmosphere to melt. After this temperature had been maintained for 30 minutes, or after further heated for a short time to just above the melting point of Ge, the assembly was slowly cooled at the rate of about 5° C./hr. to approximately 860° C., and then was subjected to air cooling. In this case too, as shown in FIG. 13, a crystallized layer 5''' of GaAs was grown to the thickness of approximately 100μ on the upper surface of the substrate Si crystal wafer 1''', and a heterojunction of Si and GaAs was formed. In order to improve the wetting between Si and GaAs, heating the assembly for a short time to just above the melting point before the slow cooling is effective. In this case, the influence of Ge atom, the same group element as Si, intruded into the substrate Si crystal on the characteristics of the heterojunction is hardly recognizable. The composition of the alloy wafer 2''' can of course be varied within the range regulated by ΔT in FIG. 5 and on the higher side of GaAs concentration than the eutectic point.

As hereinbefore described in the examples, the requisite for the method of the invention is that two kinds of semiconductors whose crystal structures and interatomic distances are similar to each other form binary or quasibinary phase diagrams respectively with the same specific solvent material, and a eutectic temperature line exists in at least one of the phase diagrams, which eutectic temperature is lower than the melting point of the solvent material. When the eutectic temperature line exists also in the other phase diagram, there should exist a difference between the two eutectic temperatures. One of the favorable conditions for embodying the present invention is that the solvent material used has a sufficiently small solid solubility at the solidification temperature to the crystallizing semiconductor material or the distribution coefficient thereof is small, or even if the solvent material melts into the crystallized layer to form a solid solution, it exerts little influence on the electrical properties of the crystallized layer.

In view of these conditions, there are more combinations of semiconductor and solvent material to which the present invention is applicable other than the aforementioned examples, some of which are:

| Materials to form heterojunction: | Solvent |
|---|---|
| Si and AlP | Al |
| Ge and ZnSe | Zn or Ag |
| GaSb and InAs | Sb |
| Ge and CuBr | Cu or Ag |
| Ge and GaAs | Ag or Cu |

Some advantages of the method of the present invention are as follows:

(1) Apparatus is less complicated and the operation thereof is easier compared with epitaxial vapor growth method; suitable for mass production of heterojunction elements.

(2) Applicable to a combination of semiconductors to which the epitaxial vapor growth method can not be applied because of inexistence of an appropriate chemical reaction or the like.

(3) Control of doping is easier compared with the epitaxial vapor growth method. As a result, the technique of well known melt growth method can be extensively used jointly; for example, a p-n junction can be formed close to a heterojunction by mixing two types of dopants having different distribution coefficients in the solvent.

(4) The thickness of a grown layer can be made markedly thicker compared with the epitaxial vapor growth method, and the formation of the heterojunction is more certain compared with known liquid phase growing method.

What we claim is:

1. A method of producing a crystal wherein a heterojunction is formed between dissimilar semiconductor materials which comprises interposing a layer of a solvent material between a first semiconductor material and a second semiconductor material, said solvent material being capable of forming a first eutectic solution with said first semiconductor material and a second eutectic solution with said second semiconductor material, the eutectic point of said second eutectic solution being lower than that of said first eutectic solution, heating the resulting composite to a temperature between the eutectic point of said first eutectic solution and the eutectic point of said second eutectic solution to dissolve the solvent material layer and at least a part of said second semiconductor layer adjacent to said solvent layer to form a mixture solution, and cooling said composite to recrystallize the second semiconductor material on said first semiconductor material, thereby forming a heterojunction therebetween.

2. The method of claim 1, wherein the first semiconductor material is Si, the second semiconductor material is Ge, and the solvent material is Ag.

3. A method of producing a crystal wherein a heterojunction is formed between dissimilar semiconductor materials which comprises placing an alloy of a solvent material and a first semiconductor material on a body of a second semiconductor material, said alloy being homogenized by quenching and crystallizing a molten mixture of said solvent material and said first semiconductor material and capable of forming a eutectic solution, the eutectic point of which is lower than the temperature at which the second semiconductor material dissolves in the molten alloy, the concentration of the first semiconductor material in said alloy being higher than its eutectic concentration, heating the resulting composite to a temperature higher than said eutectic point but lower than the temperature at which the second semiconductor material dissolves in the molten alloy, and cooling the composite to recrystallize the first semiconductor material on said second semiconductor material to form a heterojunction therebetween.

4. The method of claim 3, wherein the first semiconductor material is GaSb, the second semiconductor material is AlSb and the solvent material is Sb.

5. The method of claim 3, wherein the first semiconductor material is GaAs, the second semiconductor material is Si and the solvent material is Ge.

6. The method of claim 4, wherein the proportion of GaSb in the alloy is about 30 mole percent.

7. The method of claim 5, wherein the alloy containing about 20 mol percent GaAs.

8. A method of producing a crystal wherein a heterojunction is formed between dissimilar semiconductor materials which comprises contacting a first semiconductor material with a molten mixture of a solvent material and a second semiconductor material, said mixture forming a eutectic solution, the eutectic point of which is lower than the temperature at which said first semiconductor material dissolves in said molten mixture, heating the resulting mixture to a temperature higher than the eutectic point of the mixture of solvent material and second semiconductor material but lower than the dissolving temperature of said first semiconductor material, the concentration of said second semiconductor material in said mixture being higher than its eutectic concentration, and cooling the molten mixture to recrystallize said second semiconductor material on said first semiconductor material to form a heterojunction therebetween.

9. The method of claim 8, wherein the molten mixture is an alloy of the solvent material and the second semiconductor material, said molten mixture being prepared by heating an alloy of the solvent material and the second semiconductor material.

10. The method of claim 8, wherein the first semiconductor material is InAs, the second semiconductor material is HgTe, and the solvent material is InSb.

11. The method of claim 10, wherein the proportion of HgTe in the mixture is about 18 mole percent.

12. The method of claim 8, wherein the first and second semiconductor materials are Si and AlP respectively, and the solvent material is Al.

13. The method of claim 8, wherein the first and second semiconductor materials are Ge and ZnSe respectively, and the solvent material is selected from the group consisting of Zn and Ag.

14. The method of claim 8, wherein the first and second semiconductor materials are GaSb and InAs respectively, and the solvent material is Sb.

15. The method of claim 8, wherein the first and second semiconductor materials are Ge and CuBr respectively, and the solvent material is selected from the group consisting of Cu and Ag.

16. The method of claim 8, wherein the first and second semiconductor materials are Ge and GaAs respectively, and the solvent material is selected from the group consisting of Ag and Cu.

References Cited

UNITED STATES PATENTS

| | | | |
|---|---|---|---|
| 3,351,502 | 11/1967 | Rediker | 148—177 |
| 3,290,188 | 12/1966 | Ross | 148—177 |
| 3,411,946 | 11/1968 | Tramposch | 148—1.6 |

RICHARD O. DEAN, Primary Examiner

U.S. Cl. X.R.

148—1.6, 171, 172, 177, 185